United States Patent [19]
Kibayashi et al.

[11] Patent Number: 5,256,987
[45] Date of Patent: Oct. 26, 1993

[54] POWER AMPLIFIER DEVICE HAVING A PLURALITY OF POWER AMPLIFIER UNITS CONNECTED IN PARALLEL

[75] Inventors: Toshimitsu Kibayashi, Kawasaki; Yoshifumi Toda, Tokyo, both of Japan

[73] Assignee: Fujitsu Limited, Kawasaki, Japan

[21] Appl. No.: 717,835

[22] Filed: Jun. 21, 1991

[30] Foreign Application Priority Data

Jun. 22, 1990 [JP] Japan .................. 2-164395

[51] Int. Cl.⁵ .............................................. H03F 3/68
[52] U.S. Cl. .................................. 330/295; 330/286; 330/51; 330/284
[58] Field of Search ............... 330/295, 51, 54, 124 R, 330/286, 284

[56] References Cited

U.S. PATENT DOCUMENTS

| | | | |
|---|---|---|---|
| 4,598,252 | 7/1986 | Andricos | 330/295 |
| 4,868,520 | 9/1989 | Terakawa et al. | 330/295 |
| 4,893,093 | 1/1990 | Cronauer et al. | 330/295 |
| 5,012,200 | 4/1991 | Meinzer | 330/295 |
| 5,017,888 | 5/1991 | Meinzer | 330/295 |

FOREIGN PATENT DOCUMENTS

| | | |
|---|---|---|
| 52-119850 | 10/1977 | Japan . |
| 56-112106 | 9/1981 | Japan . |
| 60-68705 | 4/1985 | Japan . |
| 62-196910 | 8/1987 | Japan . |
| 62-217708 | 9/1987 | Japan . |

*Primary Examiner*—Steven Mottola
*Attorney, Agent, or Firm*—Armstrong, Westerman, Hattori, McLeland & Naughton

[57] ABSTRACT

A power amplifier device includes m power amplifier units provided in parallel where m is an integer, a distributor for distributing an input signal to the m power amplifier units, and a combining device for combining m amplified input signals output by the m power amplifier to generate an amplified output signal. The power amplifier device includes a group of switches for gradually disconnecting the m power amplifier units from the distributor and the combining device and for gradually connecting the m power amplifier units to the distributor and the combining device.

28 Claims, 10 Drawing Sheets

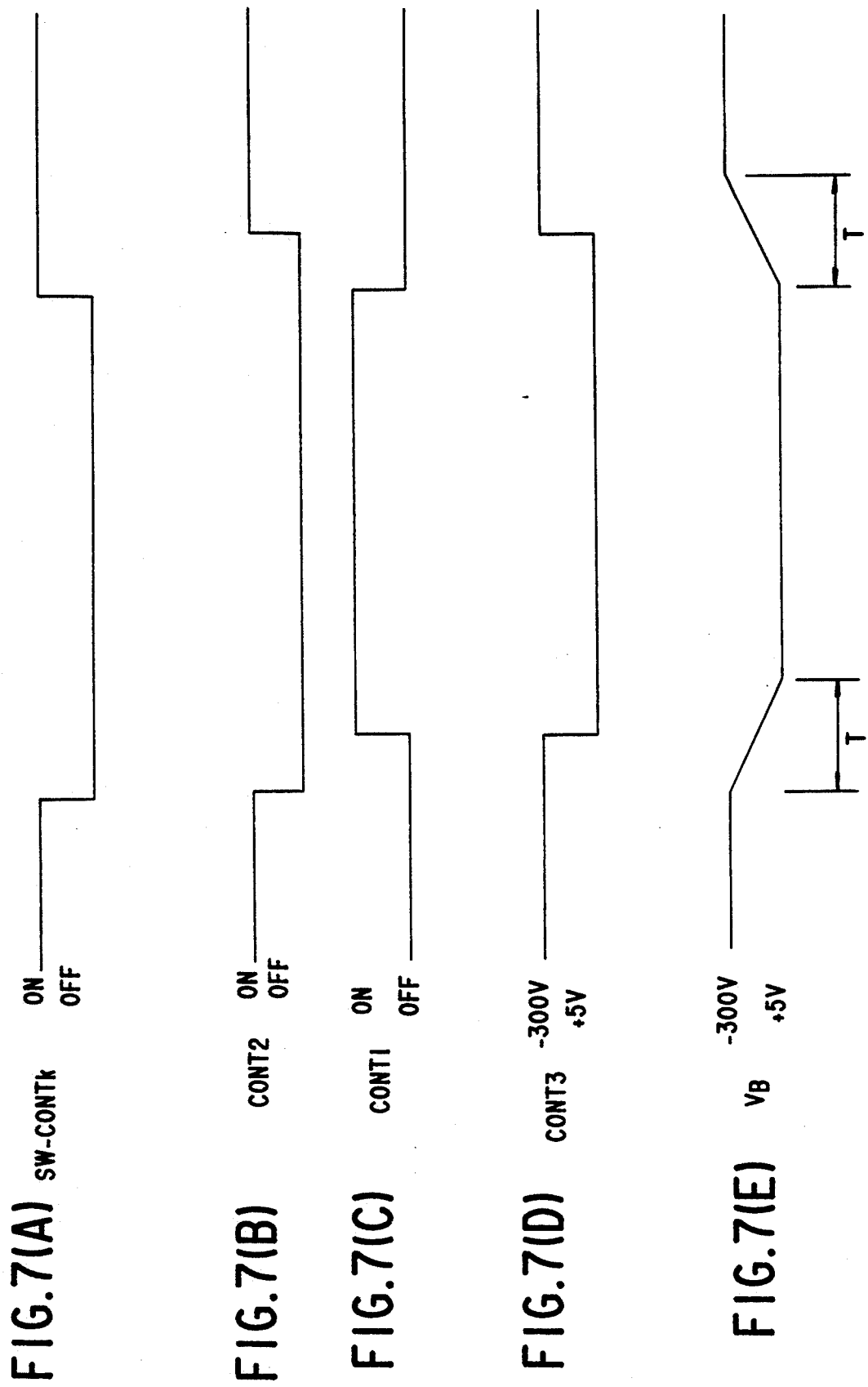

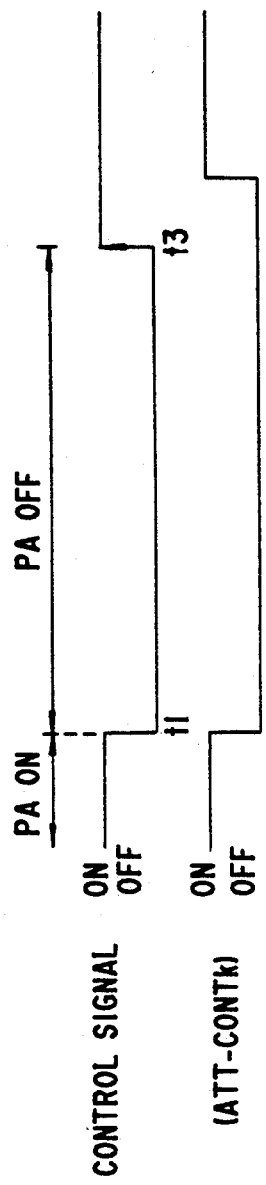
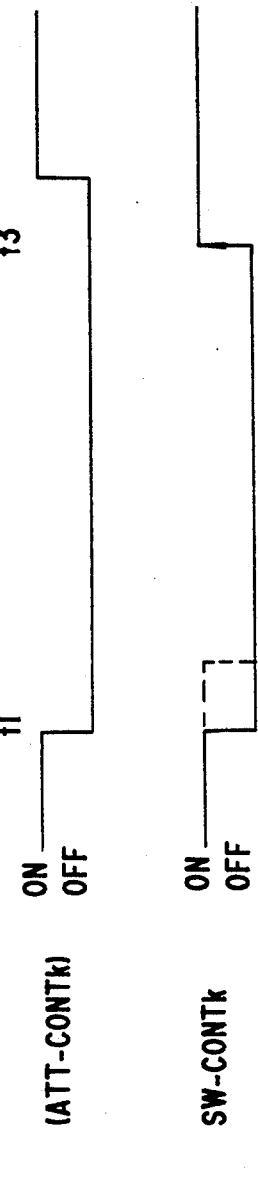
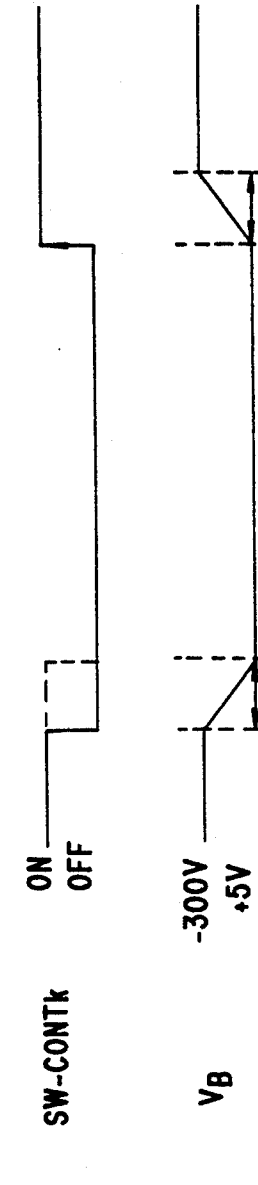
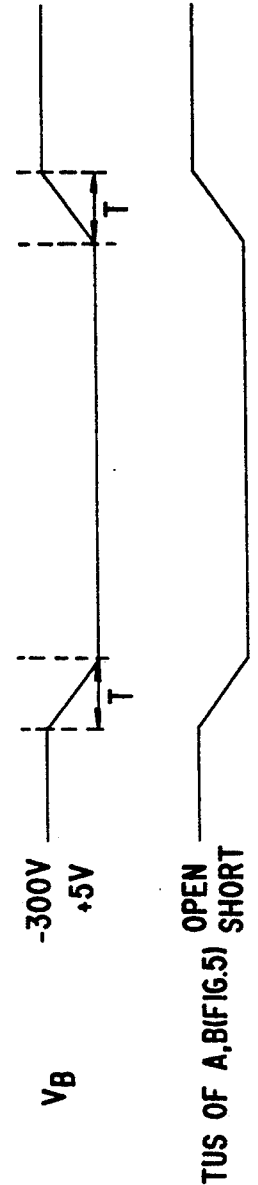
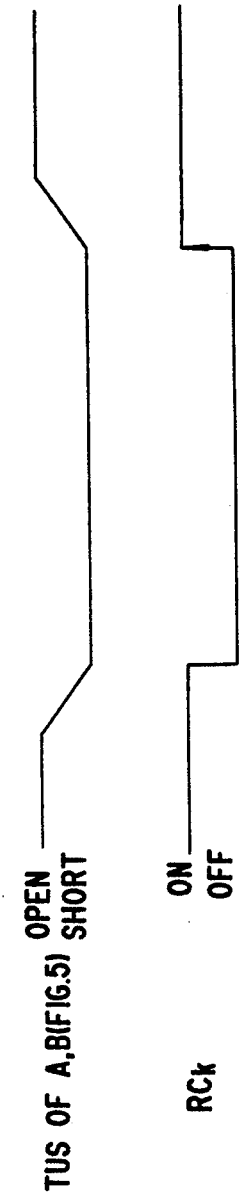
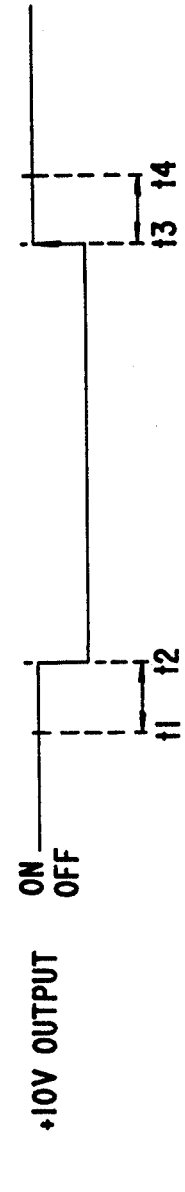
FIG.8(A) CONTROL SIGNAL
FIG.8(B) (ATT-CONTk)
FIG.8(C) SW-CONTk
FIG.8(D) $V_B$
FIG.8(E) STATUS OF A,B(FIG.5)
FIG.8(F) RCk
FIG.8(G) +10V OUTPUT POWER AMPLIFIER DEVICE HAVING A
PLURALITY OF POWER AMPLIFIER UNITS
CONNECTED IN PARALLEL

BACKGROUND OF THE INVENTION

The present invention generally relates to power amplifier devices, and more particularly to a power amplifier devices having a plurality of power amplifier units connected in parallel.

A communication device, such as an FM multiplex radio device or a radio device mounted on a vehicle, has a power amplifier device, which amplifies a signal having a small amount of power in order to obtain a power enough to emit a radio wave. Normally, such a power amplifier device has a plurality of power amplifier units connected in parallel, an input distributor (input power divider) and an output power combining device. An input information signal is input to the power divider, which equally distributes the power of the input information signal to the power amplifier units. Then, the power amplifier units respectively amplify the power-divided input information signals, which are input to the output power combining device, so that an amplified power great enough to transmit the input information signal can be obtained.

FIG. 1 is a block diagram of a conventional power amplifier device as described above. The power amplifier device shown in FIG. 1 includes an input distributor unit 60, four connectors $65_1$, $65_2$, $65_3$ and $65_4$, four power amplifier units $66_1$, $66_2$, $66_3$ and $66_4$, four connectors $67_1$, $67_2$, $67_3$ and $67_4$, and an output power combining unit 72.

The input distributor unit 60 is composed of a circulator 62 having an input impedance Z0, and transmission lines (TL) 63, $64_1$, $64_2$, $64_3$ and $64_4$. An input information signal applied to a terminal 61 passes through the circular 62 and the transmission line 63. The transmission line 63, which has a characteristic impedance Z1 and a length $\lambda g/4$ ($\lambda g$ is a wavelength), functions to transform the input impedance. Then, the input information signal is divided into four signal components, which are respectively input to the power amplifier units $66_1$–$66_4$ via the transmission lines $64_1$–$64_4$ and the connectors $65_1$–$65_4$. Each of the transmission lines $64_1$–$64_4$ has the characteristic impedance Z0 and a length of $\lambda g/4$. The power amplifier units $66_1$–$66_4$ respectively amplify the divided input information signal components.

The power amplifier units $66_1$–$66_4$ are respectively comprised of circulators $661_1$–$661_4$, unit amplifiers $662_1$–$662_4$, and circulators $663_1$–$663_4$. The amplified information signal components output by the power amplifier units $66_1$–$66_4$ pass through the connectors $67_1$–$67_4$ and transmission lines $68_1$–$68_4$, respectively, and are then combined with each other. Each of the transmission lines $68_1$–$68_4$ has the characteristic impedance Z0, and a length equal to $\lambda g/2$. Then, the resultant input signal passes through the transmission line 69 and the circulator 70, and is output, as a transmission output signal, via a terminal 71. The transmission line 69 has the characteristic impedance Z1 and a length of $\lambda g/4$. The power amplifier device shown in FIG. 1 is capable of producing a power approximately four times the power of the input information signal. Each of the transmission lines 63, $64_1$–$64_4$, $68_1$–$68_4$ and 69 is comprised of a strip line or a coaxial cable. The transmission lines $68_1$–$68_4$ and 69, and the circulator 70 form the output power combining unit 72.

The power amplifier device shown in FIG. 1 is accommodated into a rack in a radio ground station in a fixed communication system or a mobile communication system. Normally, it is not necessary for the four power amplifier units $66_1$–$66_4$ to always work. For example, when a high power is needed because of the occurrence of short-term fading, the four power amplifier units $66_1$–$66_4$ are made to operate in parallel. In a normal state, for example, three of the four power amplifier units $66_1$–$66_4$ are made to operate in parallel. When there is little traffic, for example, at night, two of the four power amplifier units $66_1$–$66_4$ are made to operate. In the above-mentioned cases, a power source is disconnected from the power amplifier units which are to be stopped (see Japanese Laid-Open Patent Publication No. 62-217708).

As shown in the above Japanese publication, the power supply to the power amplifier units which are to be stopped is simply turned OFF, and is simply turned OFF in order to turn OFF these power amplifier units. Thus, harmonic waves occur at the time of turning ON/OFF the power supply. Such harmonic waves affect the operation of the other power amplifier units and result in noise on a power supply line. Further, an abrupt change in the power supply voltage affects some circuit elements of the power supply units, and may shorten the life time thereof.

SUMMARY OF THE INVENTION

It is a general object of the present invention to provide an improved power amplifier device in which the above-mentioned disadvantages are eliminated.

A more specific object of the present invention is to provide a power amplifier device in which one or more power supply units can be stopped and restarted without resulting in noise and affecting other power supply units.

These objects of the present invention are achieved by a power amplifier device comprising: m power amplifier units provided in parallel where m is an integer; distributing means, operatively coupled to the m power amplifier units, for distributing an input signal to the m power amplifier units; combining means, operatively coupled to the m power amplifier units, for combining m amplified input signals output by the m power amplifier to generate an amplified output signal; and switch means, operatively coupled to the power amplifier units, for gradually disconnecting the m power amplifier units from the distributing means and the combining means and for gradually connecting the m power amplifier units to the distributing means and the combining means.

The above-mentioned objects of the present invention are also achieved by a power amplifier device comprising: m power amplifier units provided in parallel where m is an integer; distributing means, operatively coupled to the m power amplifier units, for distributing an input signal to the m power amplifier units; combining means, operatively coupled to the m power amplifier units, for combining m amplified input signals output by the m power amplifier to generate an amplified output signal; control means, operatively coupled to the m power amplifier units, for respectively controlling the m power amplifier units to reduced gains in accordance with a control signal; and switch means, operatively coupled to the power amplifier units, for respectively disconnecting the m power amplifier units from the distributing means and the combining means after the control means respectively makes the m power amplifier units inactive and for respectively connecting the m power amplifier units to the distributing means and the combining means before the control means respectively stops controlling the m power amplifier units to the reduced gains.

BRIEF DESCRIPTION OF THE DRAWINGS

Other objects, features and advantages of the present invention will become more apparent from the following detailed description when read in conjunction with the accompanying drawings, in which:

FIG. 7 is a waveform diagram showing the operation of the bias voltage generator shown in FIG. 6;

FIG. 8 is a waveform diagram showing the operation of the configuration shown in FIG. 5;

DESCRIPTION OF THE PREFERRED EMBODIMENTS

Figure 1:
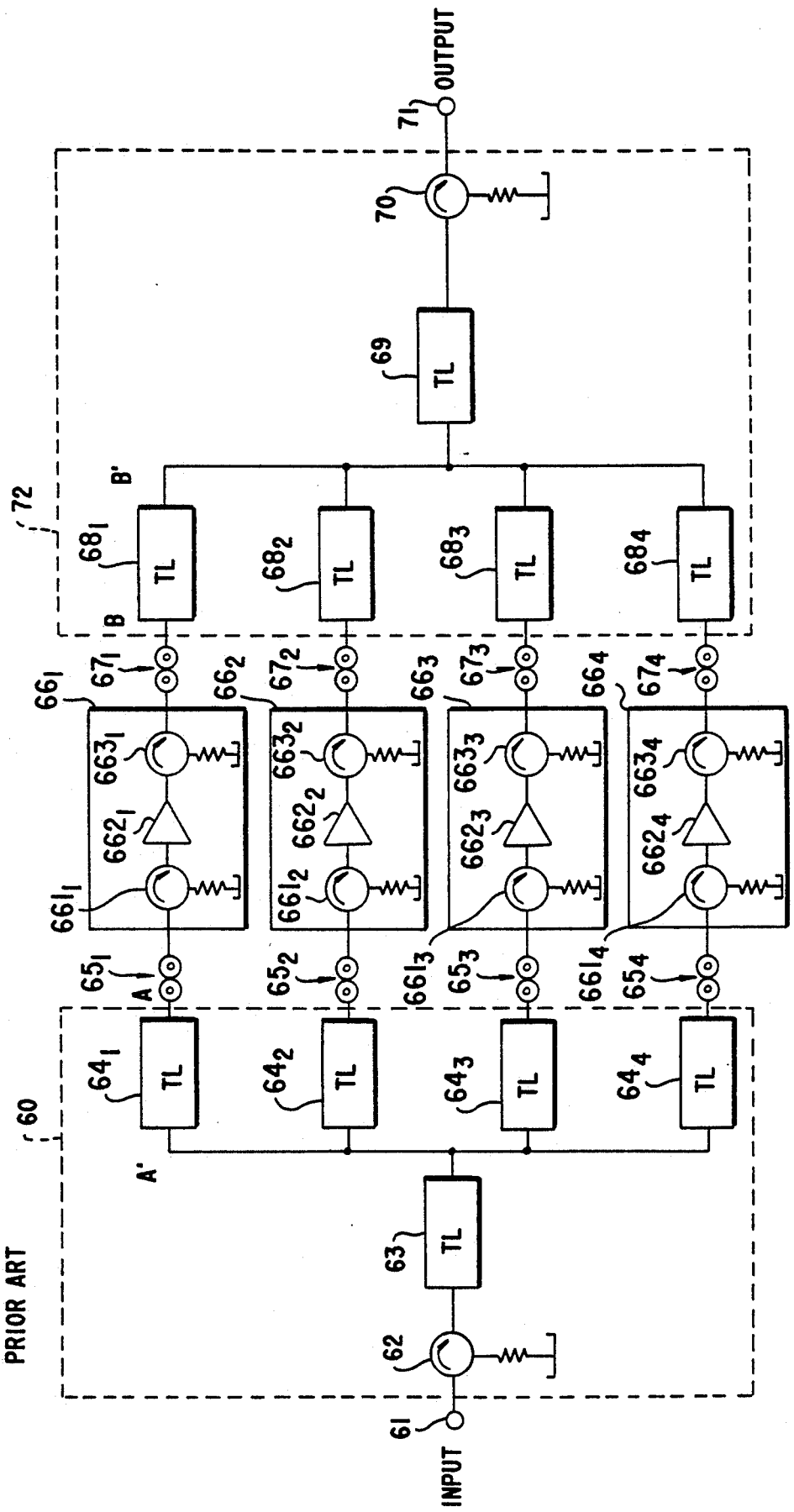
FIG. 1 is a block diagram of a conventional power amplifier device.
Figure 2:
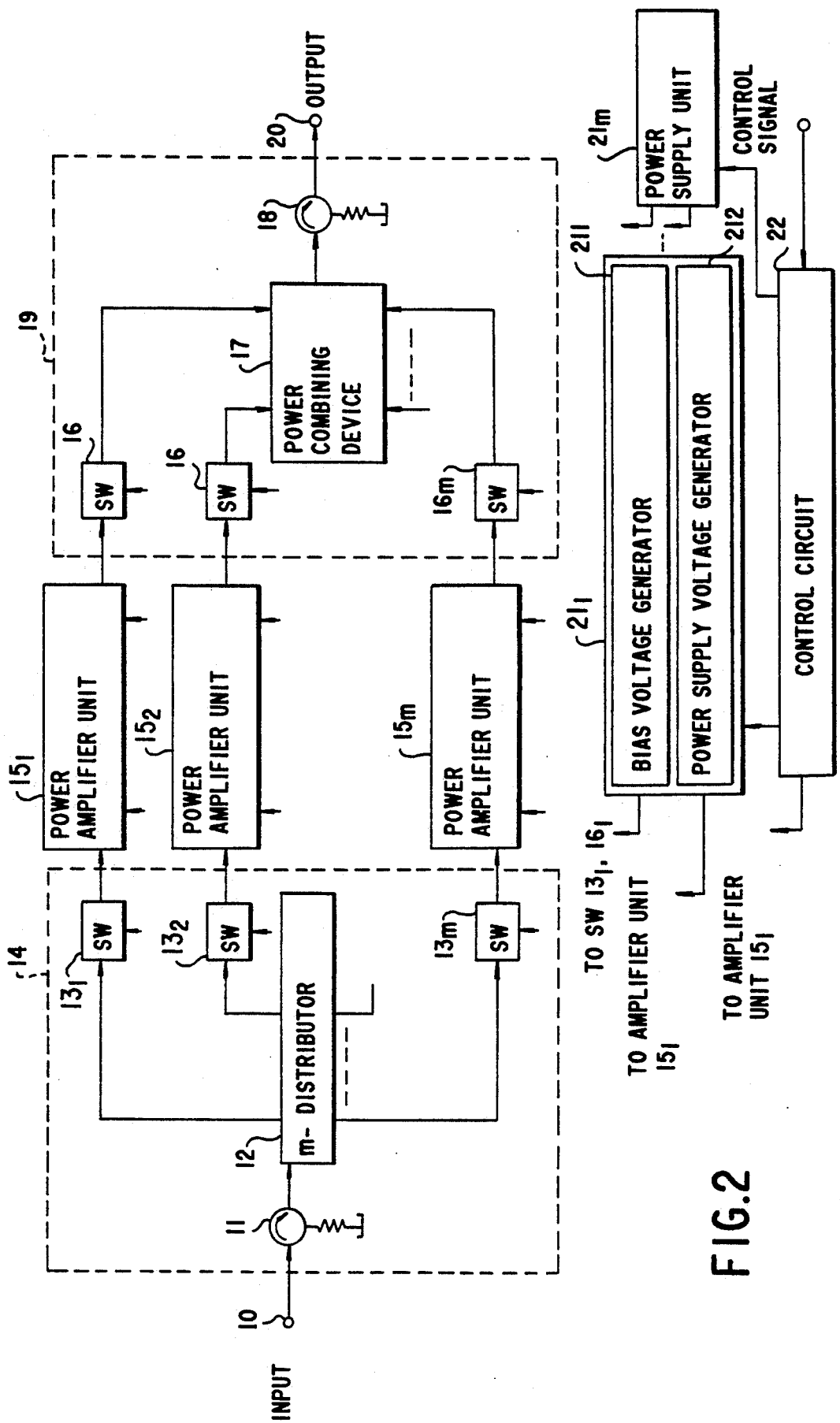
FIG. 2 is a block diagram showing an outline of a power amplifier device according to the present invention.

Referring to FIG. 2, a power amplifier device of the present invention is made up of an input distributor unit 14, m power amplifier units $15_1$-$15_m$ (m is an integer), and an output power combining unit 19. The input distributor unit 14 is made up of a first circulator 11, an m-distributor 12, and m first switches (SW) $13_1$-$13_M$. The first circulator 11 is connected to an input terminal 10, and makes an impedance matching with a circuit provided on the input side of the first circulator 11. The m-distributor 12 equally distributes an input signal from the first circulator 11 to the first switches $13_1$ and $13_m$, which have the respective functions of allowing the distributed input signals to be output to the power amplifier units $15_1$-$15_m$ and preventing the distributed input signals from being output thereto.

The power amplifier units $15_1$-$15_m$ separately amplify the respective distributed input signals. The output power combining unit 19 is made up of m second switches $16_1$-$16_m$, a power combining device 17, and a second circulator 18. The second switches $16_1$-$16_m$ respectively allow amplified input signals output by the amplified units $15_1$-$15_m$ to be output to the power combining device 17 and prevent them from being output thereto. The power combining device 17 has an impedance transform function and the function of combining the amplified input signals passing through the second switches $16_1$-$16_m$ with each other. The second circulator 18 makes an impedance matching with a load coupled to an output terminal 20.

Further, the power amplifier device shown in FIG. 2 has power supply units $21_1$-$21_m$ provided for the respective power amplifier units $15_1$-$15_m$, and a control circuit 22. The power supply unit $21_l$ includes a bias voltage generator 211 and a power supply voltage generator 212. The bias voltage generator 211 supplies voltages to the first switch $13_l$ and the second switch $16_l$, and the power supply voltage generator 212 supplies a power supply voltage to the power amplifier unit $15_l$. The power supply unit $21_l$ operates under the control of the controller 22, which is controlled by a control signal supplied from an external device, such as a central ground station. Each of the other power supply units $21_2$-$21_m$ is configured in the same way as the power supply unit $21_1$.

Figure 3:
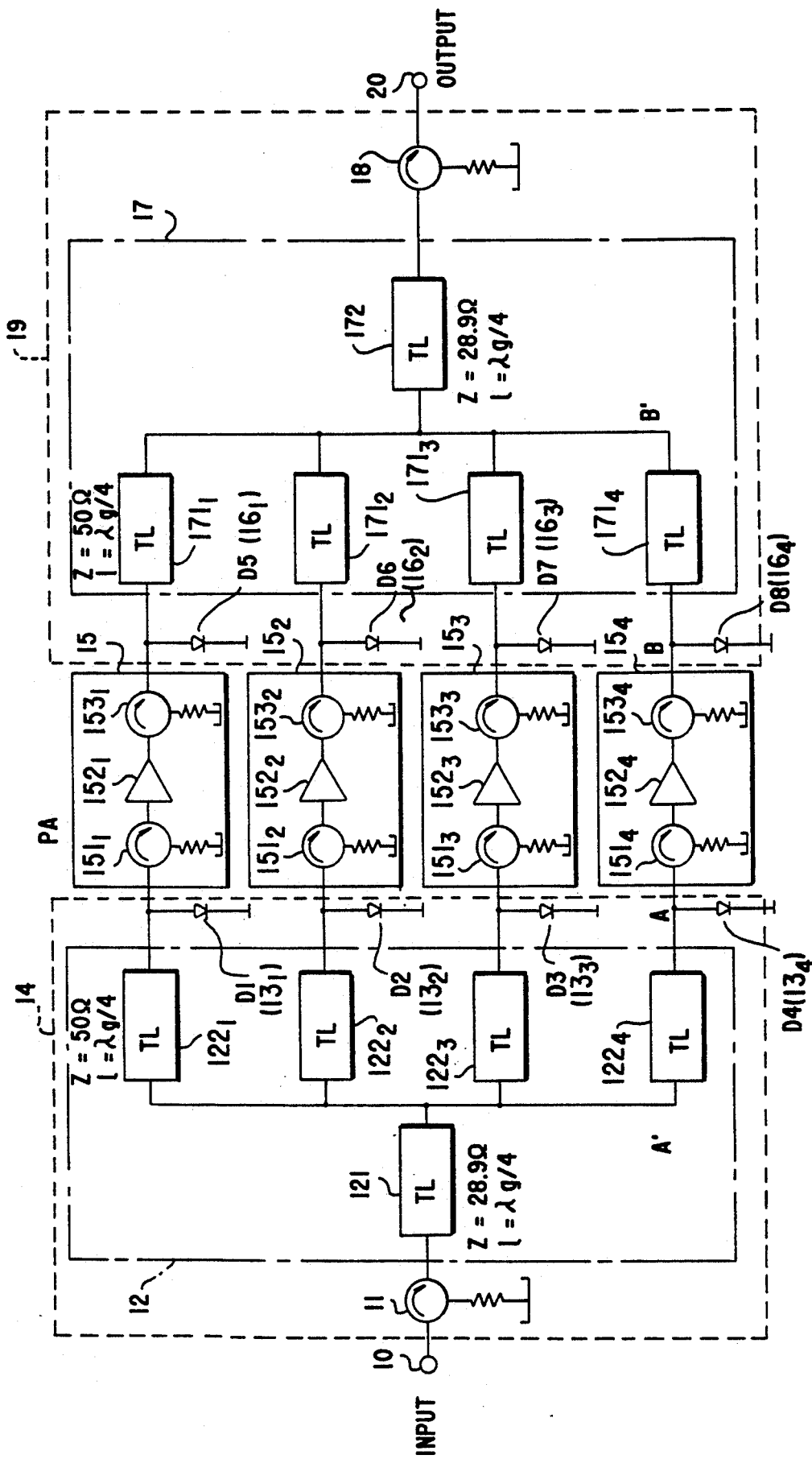
FIG. 3 is a block diagram of a first preferred embodiment of the present invention.

FIG. 3 illustrates the structure of the input distributor unit 14, the power amplifier units $15_1$-$15_m$ and the output power combining unit 19 in more detail, in which m=4. The input impedance of the circulator 11 is equal to 50 ohms, and the input impedance of the circulator 18 is equal to 50 ohms. The switches $13_1$ through $13_m$ shown in FIG. 2 are formed of PIN diodes D1 through D4, respectively, and the switches $16_1$ through $16_m$ are formed of PIN diodes D5 through D8, respectively.

The cathodes of the PIN diodes D1 through D8 are grounded. The anodes of the PIN diodes D1 through D4 are connected to the corresponding output terminals of the m-distributor 12, and the anodes of the PIN diodes D5 through D8 are connected to the corresponding input terminals of the power combining device 17. Bias voltages generated by the power supply units $21_1$-$21_4$ shown in FIG. 2 are applied to the anodes of the PIN diodes D1 through D4, respectively. The same bias voltages applied to the PIN diodes D1 through D4 are applied to the anodes of the PIN diodes D5 through D8, respectively.

The amplifier unit $15_1$ is made up of two circulators $151_1$ and $153_1$, and a unit amplifier $152_1$, all of which are connected in series in the order shown in FIG. 3. Also, the mth power amplifier unit $15_m$ is made up of two circulators $151_m$ and $153_m$, and a unit amplifier $152_m$.

It is now assumed that in a standard mode, three of the four power amplifier units $15_1$-$15_4$ are operating in parallel in order to reduce a mismatch loss. During modes other than the standard mode, two or all of the four power amplifier units $15_1$-$15_4$ are operating.

The m-distributor 12 of the input distributor unit 14 is composed of a transmission line (TL) 121 and four transmission lines (TL) $122_1$ through $122_4$. The power combining device 17 of the output power combing unit 19 is made up of four transmission lines (TL) $171_1$ through $171_4$, and a transmission line 172.

The characteristic impedances of the transmission lines 121, $122_1$-$122_4$, $171_1$-$171_4$, and 172 will be described below. The internal structure of the m-distributor 12 is symmetrical with that of the power combining device 17 except that the flow of the signals passing through the m-distributor 12 are opposite to that of the signals passing through the power combining device 17. From this point of view, the equivalent circuit of each of the m-distributor 12 and the power combining device 17 is illustrated as shown in FIG. 4, in which those parts which are the same as those shown in FIG. 3 are given the same reference numerals.

Figure 4:
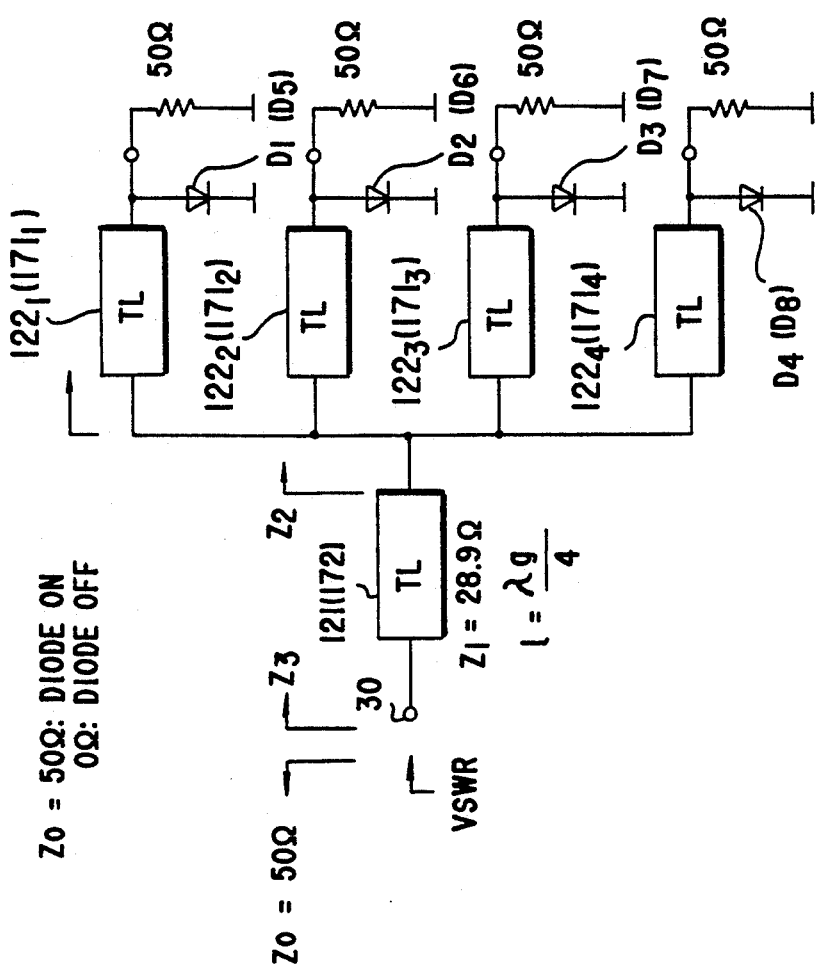
FIG. 4 is an equivalent diagram of an output power combining device and an input power distributor shown in FIG. 3.

Referring to FIG. 4, the impedance Z2 obtained by viewing a 50-ohm load from the transmission line 121

(172), which is formed of a strip line or a coaxial cable, is described as follows:

$$Z2 = 50^X/(x \cdot 50^{X-1}) \text{(ohms)}$$

where x is the number of loads connected in parallel. As has been described previously, three of the four unit amplifiers $15_1$–$15_4$ are operating in the standard mode, so that x is set equal to 3 as a standard value. Thus, the impedance Z2 is equal to 16.7 ohms (approximately equal to 50/3). It is necessary to equalize, to the characteristic impedance Z0 obtained by viewing the opposite side (circulator side) from the terminal 30, an impedance Z3 obtained by viewing the load side from the end of the transmission line 121 (172) where the transmission lines $122_1$–$122_4$ are not connected. Thus, Z3=Z0=50 ohms. The transmission line 121 has the characteristic impedance Z1 and the length equal to $\lambda g/4$. It is possible to obtain the characteristic impedance Z1 by the following formula:

$$Z1 = \sqrt{Z2 \cdot Z3} = \sqrt{Z2 \cdot Z0} .$$

By inserting Z2=16.7 ohms and Z0=50 ohms into the above formula, Z1 is equal to 28.9 (approximately equal to 50/3) ohms. It can be seen from the above that it is possible to reduce the mismatching loss to a minimum value even when two or all of the four unit amplifiers $15_1$–$15_4$ operate while three of them operate in the standard mode.

Returning now to FIG. 3, the PIN diodes D1–D4 and PIN diodes D5–D8 are reversely biased while all of the unit amplifiers $15_1$–$15_4$ are being operated. More specifically, negative (reverse) D.C. bias voltages which are respectively generated by the power supply units $21_1$–$21_4$ and which are sufficiently lower than the ground level are applied to the anodes of the PIN diodes D1–D4. Similarly, the above-mentioned D.C. reverse bias voltages are applied to the anodes of the PIN diodes D5–D8. The application of the reverse bias voltages prevents the PIN diodes D1–D8 from rectifying the respective signals received. For example, the reverse bias voltages are set to be equal to −300 volts with the allowed power equal to 200 watts.

A description will now be given of the operation of the power amplifier device shown in FIG. 3. The input signal applied to the input terminal 10 passes through the circulator 11 and the transmission line 121. As has been described previously, the transmission line 121 has the characteristic impedance Z1 equal to 28.9 ohms and the length equal to $\lambda g/4$, and functions to match the impedance to the impedance Z2 (=16.7 ohms). Then, the input signal is divided into four input signals by the transmission lines $122_1$–$122_4$, each of which has a characteristic impedance of 50 ohms and a length of $\lambda g/4$. Then, the distributed input signals from the transmission lines are input to the power amplifier units $15_1$–$15_4$, respectively, while the PIN diodes D1–D4 are reversely biased. The power amplifier units $15_1$–$15_4$ amplify the respective input signals, and output the amplified input signals to the transmission lines $171_1$–$171_4$, respectively. Since the PIN diodes D5–D8 are reversely biased, the amplified input signals are not allowed to pass through the PIN diodes D5–D8. Then, the amplified input signals are combined with each other by the transmission lines $171_1$–$171_4$, each of which has a characteristic impedance of 50 ohms and a length of $\lambda g/4$. The resultant input signal passes through the transmission line 172, which has a characteristic impedance of 28.9 ohms and a length of $\lambda g/4$ and which has the function of transforming the impedance to 50 ohms. Then, the resultant input signal, which has a power of, for example 100 watts, passes through the circulator 18, and is applied to the output terminal 20.

Figure 5:
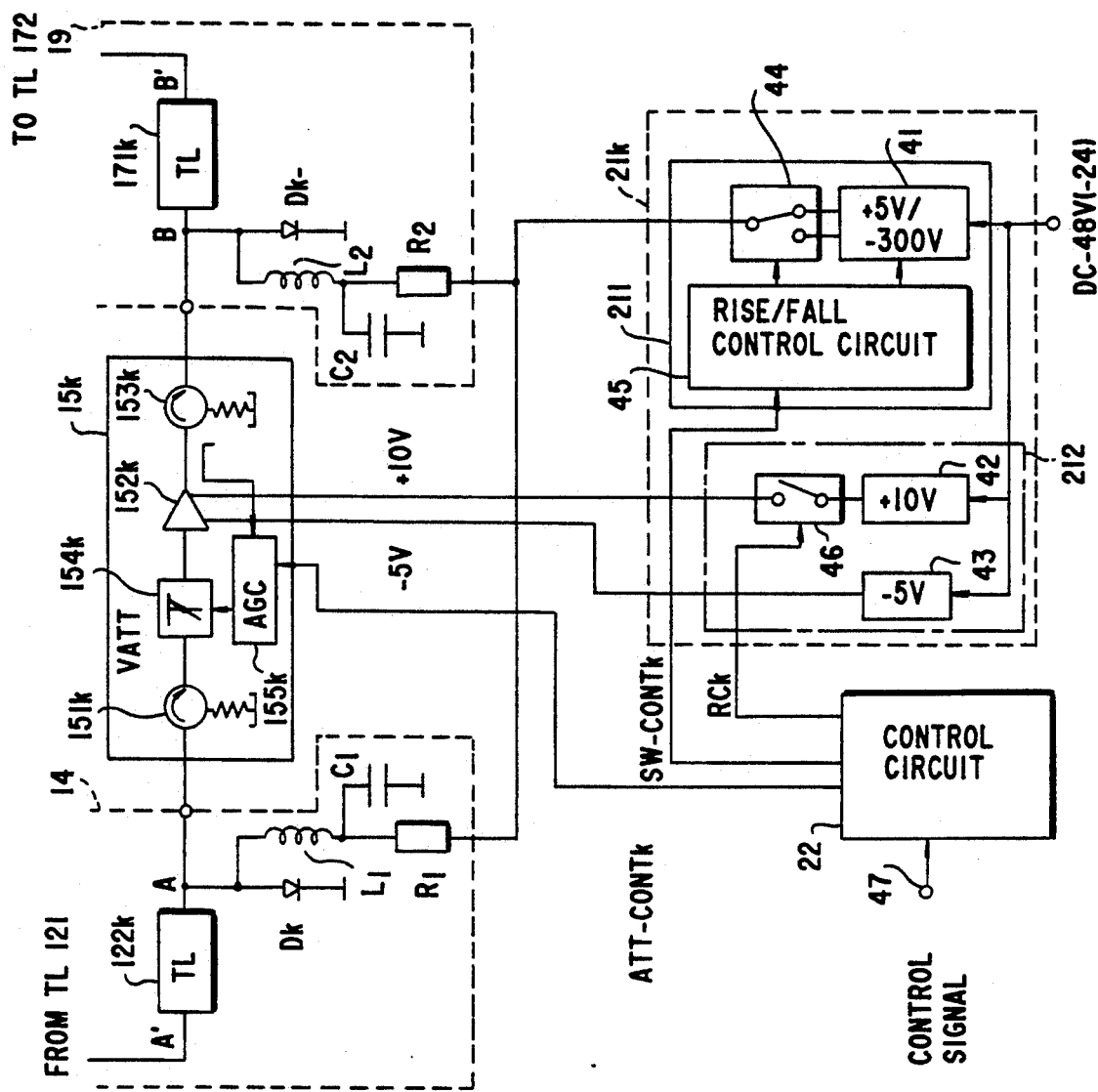
FIG. 5 is a block diagram of the first preferred embodiment of the present invention in more detail.

FIG. 5 illustrates the structure of the kth power amplifier unit $15_k$ (k=1, 2, . . . , m) and the kth power supply unit $21_k$. It will be noted that the power amplifier units $15_1$–$15_m$ are the same as each other and the power supply units $21_1$–$21_m$ are the same as each other.

The power amplifier unit $15_k$ includes a variable attenuator $154_k$, and an automatic gain control (AGC) circuit $155_k$ in addition to the aforementioned two circulators $151_k$ and $153_k$ and the unit amplifier $152_k$. It will be noted that the variable attenuator $154_k$ and the AGC circuit $155_k$ are omitted in FIG. 3 for the sake of simplicity.

As has been described previously, the power supply unit $21_k$ includes the bias voltage generator 211 and the power supply voltage generator 212. The bias voltage generator is made up of a +5V/−300 V voltage generator 41, a switch 44 and a rise/fall control circuit 45. The voltage generator 41 generates +5 V and −300 V from an external voltage of, for example, −48 V (and/or −24 V) generated and supplied from an external device. Under the control of the rise/fall control circuit 45, the voltage generator 41 generates voltages of +5 V and −300 V. As will be described later, the rise/fall control circuit 45 generates two ON/OFF control signals related to +5 V and −300 V. The selector 44 selects either +5 V or −300 V in accordance with a switch control signal generated by the rise/fall control circuit 45.

The power supply voltage generator 212 is made up of a +10 V voltage generator 42, a −5 V voltage generator 43 and a switch 46. The voltage generator 42 generates a power supply voltage of +10 V from the external voltage equal to a power supply voltage of −48 V (or −24 V), and the voltage generator 43 generates −5 V therefrom. The power supply voltage equal to +10 V generated by the voltage generator 42 passes through the switch 46, and is applied to the unit amplifier $152_k$. The switching operation of the switch 46 is controlled by a power supply control signal RCk generated and output by the control circuit 22. The supply voltage equal to −5 V generated by the voltage generator 43 is continuously supplied to the unit amplifier 152k. It will be noted that normally, the unit amplifier is comprised of a field effect transistor, which always needs a negative power supply voltage for operation.

The control circuit 22 receives the control signal from an external device via a terminal 47, and generates an attenuator control signal ATT-CONTk, and a bias control signal SW-CONTk in addition to the above-mentioned power supply control signal RCk. The attenuator control signal ATT-CONTk controls the gain of the AGC circuit 155k and thus the gain of the attenuator 154k so that the output level of the unit amplifier 152k becomes equal to a level indicated by the attenuator control signal ATT-CONTk on the basis of the output signal of the unit amplifier $152_k$.

Figure 6:
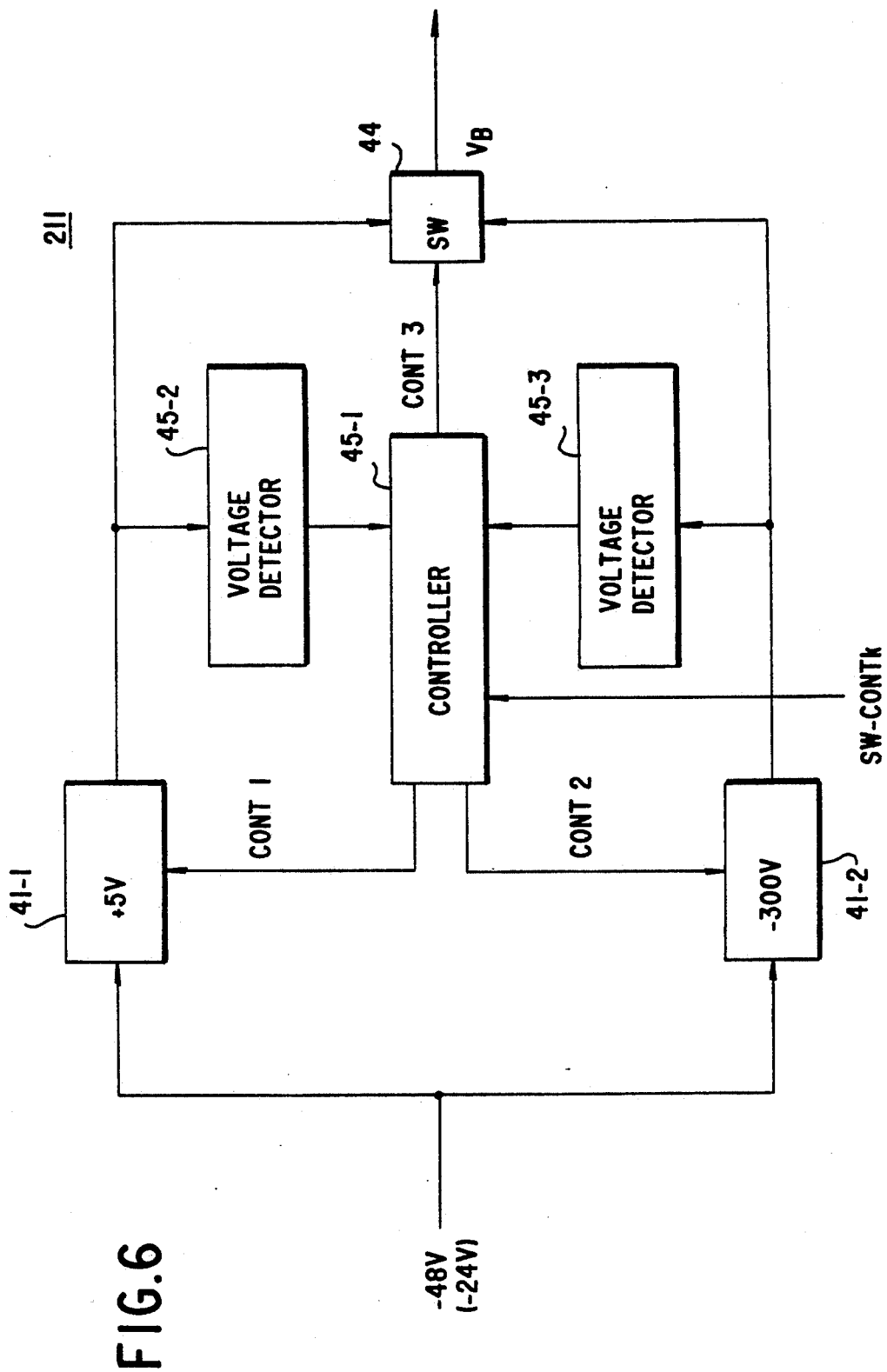
FIG. 6 is a block diagram of a bias voltage generator shown in FIG. 5.

FIG. 6 is a block diagram of the bias voltage generator 211 shown in FIG. 5. In FIG. 6, those parts which are the same as those shown in FIG. 5 are given the same reference numerals. The voltage generator 41 is composed of a +5 V generator 41-1 and −300 V generator 41-2. The rise/fall control circuit 45 shown in FIG. 5 controls the voltage generator 41 and the switch 44 so that the bias voltage gradually increases and gradually decreases. As shown in FIG. 6, the rise/fall control circuit 45 is made up of a controller 45-1, and two voltage detectors 45-2 and 45-3. The controller 45-1 receives the aforementioned bias control signal SW-CONTk and detection signals respectively output by the voltage detectors 45-2 and 45-3. Also, the controller 45-1 outputs control signals CONT1 and CONT2 to the voltage generators 41-1 and 41-2, respectively, and outputs a switch control signal CONT3 to the switch 44.

FIG. 7 is a waveform diagram illustrating the operation of the bias voltage generator 211. When the bias control signal SW-CONTk generated and output by the control circuit 47 (FIG. 5) changes from ON to OFF, the controller 45-1 changes the control signal CONT2 from ON to OFF. In response to this change in the control signal CONT2, the bias voltage labeled $V_B$ starts to gradually increase, as shown (E) of FIG. 7. At this time, the switch 44 is already switched to the voltage generator 41-2. When the bias voltage $V_B$ increases to a predetermined voltage (equal to, for example, zero volts), the voltage detector 45-3 outputs the detection signal to the controller 45-1. In response to this detection signal, the controller 45-1 changes the control signal CONT1 from OFF to ON, and at the same time, changes the control signal CONT3 so that the switch 44 switches to the voltage generator 41-1. In response to these changes, the bias voltage $V_B$ increases up to +5 V. As will be described in detail later, when the PIN diodes $D_k$ and $D_{k+4}$ are forwardly biased, the power amplifier unit $15_k$ is OFF (disconnected). It takes time T to change the bias voltage $V_B$ from −300 V to +5 V. The time T is determined on the basis of the symbol rate of the input signal of the power amplifier unit $15_k$. It is preferable that time T be sufficiently longer than a one-symbol period dependent on the symbol rate of the input signal of the power amplifier unit $15_k$. For example, time T is between 10 ms and 30 ms when the one-symbol period is equal to 50 μs with the symbol rate equal to 20 kbps. It should be noted that the power amplifier unit $15_k$ gradually changes from ON to OFF during the time T in accordance with the above-mentioned bias voltage control procedure.

When the switch control signal SW-CONTk changes from OFF to ON, the controller changes the control signal CONT1 from ON to OFF. In response to this change in the control signal CONT1, the bias voltage $V_B$ starts to gradually decrease. When the voltage detector 45-2 detects a predetermined voltage (equal to zero volts, for example), it outputs the detection signal to the controller 45-1. In response to this detection signal, the controller 45-1 changes the control signal CONT2 from OFF to ON, and at the same time, changes the control signal CONT3 so that the switch 44 switches to the voltage generator 41-2. Thereby, the bias voltage $V_B$ decreases to −300 V. It will be noted that when the PIN diodes $D_k$ and $D_{k+4}$ are reversely biased, power amplifier unit $15_k$ is ON (connected). It also takes time T to change the bias voltage $V_B$ from +5 V to −300 V. It should be noted that the power amplifier unit $15_k$ gradually changes from OFF to ON during the time T in accordance with the above-mentioned bias voltage control procedure.

Returning now to FIG. 5, a filter circuit, which is composed of a resistor R1, an inductor L1 and a capacitor C1, is connected between the anode of the diode $D_k$ and the switch 44 of the bias voltage generator 211. Similarly, a filter circuit, which is composed of a resistor R2, an inductor L2 and a capacitor C2, is connected between the anode of the diode $D_{k+4}$ and the switch 44.

A description will now be given of the operation of the circuit shown in FIG. 5 with reference to FIG. 8. When it is required that the power amplifier unit $15_k$ be turned OFF, the control circuit 22 is supplied, via the terminal 47, with the control signal generated and output by the external device (central ground station) remote from the power amplifier unit $15_k$. This control signal indicates which power amplifier unit should be turned OFF or ON. In this case, the control circuit 22 recognizes that the power amplifier unit $15_k$ should be turned OFF. At time $t_1$, the control circuit 22 changes the attenuator control signal ATT-CONTk from ON to OFF. When the attenuator control signal ATT-CONTk is OFF, the AGC circuit $155_k$ controls the variable attenuator $154_k$ so that the unit amplifier $15_k$ has a minimum gain. Also, the control circuit 22 changes the bias control signal SW-CONTk from ON to OFF at time $t_1$. In response to this change in the bias control signal SW-CONTk, the bias voltage $V_B$ generated by the bias voltage generator 211 gradually increases to +5 V from −300 V during the period T, as shown in FIG. 7. Then, the bias voltage $V_B$ becomes equal to +5 V at time $t_2$ after T from $t_1$.

The bias voltage $V_B$ is applied to the anode of the PIN diode $D_k$ via the filter circuit composed of the resistor R1, the inductor L1 and the capacitor C1, and also applied to the anode of the PIN diode $D_{k+4}$ via the filter circuit composed of the resistor R2, the inductor L2 and the capacitor C2. During the time T, each of the PIN diodes $D_k$ and $D_{k+4}$ changes from the OFF state to the ON state through an intermediate active state. Thus, as schematically shown in (E) of FIG. 8, input terminal A and output terminal B of the power amplifier unit $15_k$ gradually change from the open state to the shortcircuited state, while input and output terminals A' and A of the transmission line $122_k$ change toward the shortcircuited state from the open state, and input and output terminals B and B' change toward the shortcircuited state from the open state. At time $t_2$, the terminals A and B are completely shortcircuited. As a result, the power amplifier unit $15_k$ is substantially disconnected from the circuit at nodes A and B.

Meanwhile, the control circuit 22 changes the power supply control signal RCk from ON (high level) to OFF (low level) at time $t_2$. In response to this change in the power supply control signal RCk, the switch 46 switches to OFF from ON. Thus, the D.C. power supply voltage equal to +10 V generated by the voltage generator 42 is not applied to the unit amplifier $152_k$ via the switch 46 during the time the power supply control signal RCk is OFF. Thus, the unit amplifier $152_k$ stops operating without affecting other structural elements and causing harmonic waves.

It should be noted that the power amplifier unit $15_k$ is gradually disconnected at the nodes A and B, and the supply of the +10 V power supply voltage is stopped when the power amplifier unit $15_k$ is completely disconnected (at time $t_2$). With this arrangement, it becomes possible to prevent the occurrence of harmonic waves (spread spectra) and the superimposition of noise on the power supply line. In addition, as has been described previously, impedance matching is established, so that the input signal is efficiently applied to the active power amplifier units.

When it is required that the power amplifier unit $15_k$ which is OFF be switched to ON, the control signal 47, which is applied to the control circuit 22, indicates, at time $t_3$, that the power amplifier unit $15_k$ should be turned ON. In response to the above change in the control signal 47, the control circuit 22 changes the bias control signal SW-CONTk from OFF to ON at time $t_3$, as shown in (C) of FIG. 8. In response to this change, the bias voltage $V_B$ gradually decreases, as shown in FIG. 7. At time $t_3$, the control circuit 22 changes the power supply control signal RCk from OFF to ON. Thus, the power supply voltage generator 212 starts to supply the $+10$ V power supply voltage to the unit amplifier $152_k$. At time $t_4$, the bias voltage $V_B$ becomes equal to $-300$ V, so that the nodes A and B are opened. After T from time $t_3$ (that is, at time $t_4$), the control circuit 22 changes the attenuator control signal ATT-CONTk from OFF to ON, so that the gain of the attenuator $154_k$ is set to a predetermined level. Thus, the power amplifier unit $15_k$ outputs a predetermined power. It should be noted that the power amplifier unit $15_k$ is gradually changed from OFF to ON during the period T, and the gain of the attenuator $154_k$ is returned to the predetermined level. Thus, the aforementioned problems can be eliminated.

Figure 9:
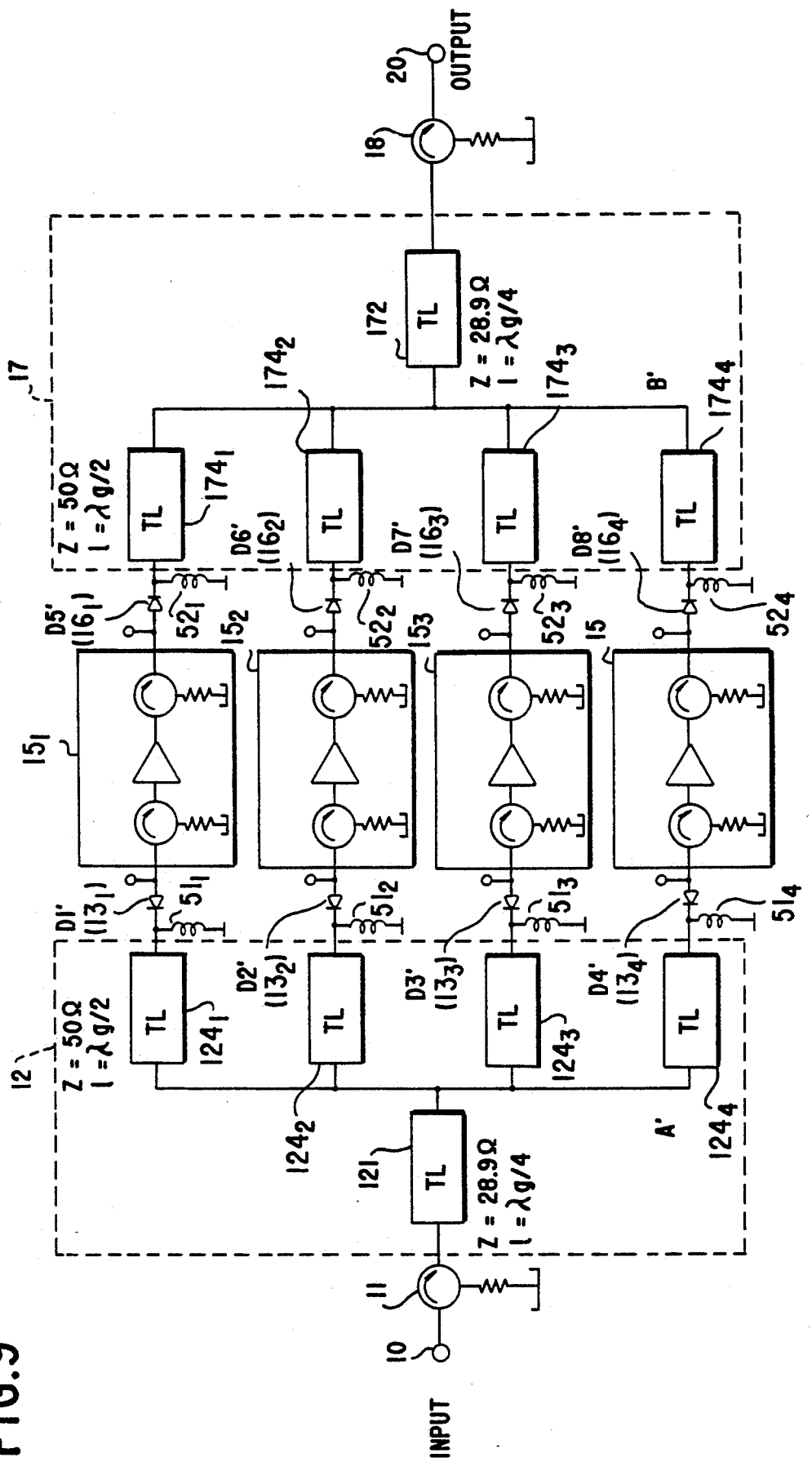
FIG. 9 is a block diagram showing a variation of the first preferred embodiment of the present invention shown in FIG. 3.

FIG. 9 shows a variation of the above-mentioned embodiment. In FIG. 9, those parts which are the same as those shown in FIG. 5 are given the same reference numerals. In the variation, PIN diodes D1' through PIN diodes D8' are substituted for the PIN diodes D1 through PIN D8, respectively. The cathodes of the diodes D1' through D4' are connected to the output ends of the transmission lines $124_1$ through $124_4$, respectively, and the anodes thereof are connected to the input terminals of the power amplifier units $15_1$ through $15_4$, respectively. The anodes of the diodes D5' through the diodes D8' are connected to the output terminals of the power amplifier units $15_1$ through $15_4$, respectively, and the cathodes thereof are connected to the input ends of the transmission lines $174_1$ through $174_4$, respectively. The bias voltages generated in the aforementioned way are applied to the anodes of the PIN diodes D1' through D8'. Bias coils $51_1$ through $51_8$ having ends grounded are connected to the cathodes of the PIN diodes D1' through D8'. The characteristic impedance of each of the transmission lines $124_1$-$124_4$ and $174_1$-$174_4$ is equal to 50 ohms, while the length thereof is equal to λg/2 (or its multiple integer) in order to establish impedance matching when the power amplifier unit sides of the transmission lines $124_1$-$124_4$ and $174_1$-$174_4$ are open.

When the power amplifier units $15_1$-$15_4$ are activated, the positive D.C. bias voltages are applied to the anodes of the PIN diodes D1' through D8' via the filter circuit, so that they are forwardly biased. Meanwhile, when the power amplifier unit $15_1$ is disconnected, the negative D.C. bias voltages are applied to the anodes of the PIN diodes D1' and D5', so that they are reversely biased enough to pass the signals. Thereby, the impedances of the transmission lines $124_1$ and $174_1$ on the side of the power amplifier unit $15_1$ are opened. Each of the other power amplifier units $15_1$-$15_4$ can be disconnected in the same way as described above. It is possible to obtained the same advantages as the configuration shown in FIG. 3.

In the aforementioned embodiment and variation, the gain of the attenuator $154_k$ is controlled in the way shown in FIG. 8. Alternatively, it is possible to maintain the attenuator control signal ATT-CONTk in the ON state even when the power amplifier unit $15_k$ is turned OFF. This alternative has sufficient advantages although they are not much better than those of the first embodiment of the present invention.

Figure 10:
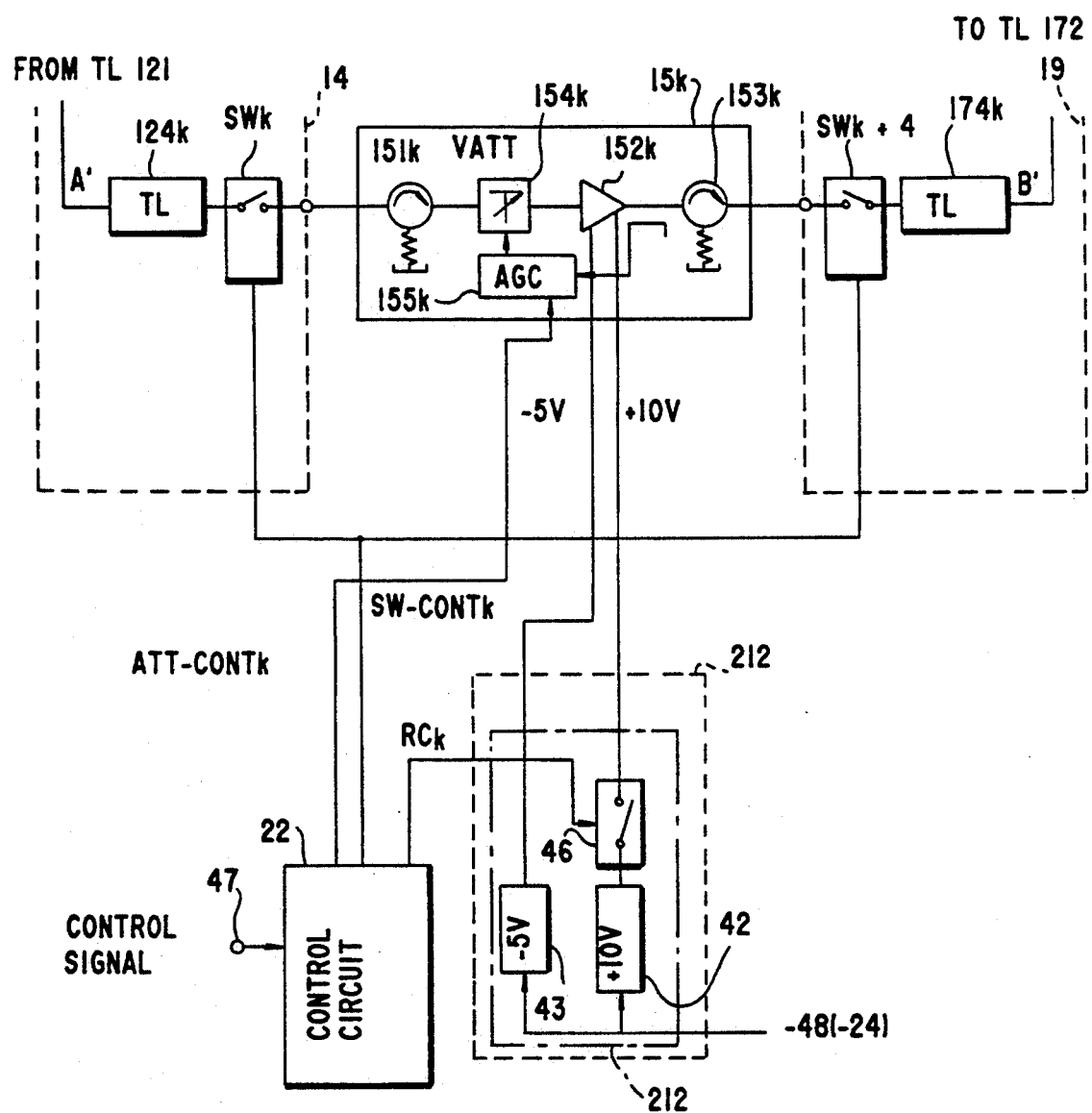
FIG. 10 is block diagram of a second preferred embodiment of the present invention.

A description will now be given of a second preferred embodiment of the present invention with reference to FIG. 10, those parts which are the same as those shown in FIG. 5 are given the same reference numerals. Switches $SW_k$ and $SW_{k+4}$ are substituted for the PIN diodes $D_k$ and $D_{k+4}$ as well as the filter circuits. The switch $SW_k$ is provided between the transmission line $124_k$ and the input terminal of the power amplifier unit $15_k$, and the switch $SW_{k+4}$ is provided between the output terminal of the power supply unit $15_k$ and the transmission line $174_k$. The switches $SW_k$ and $SW_{k+4}$ are controlled by the aforementioned kth switch control signal SW-CONTk. Since the PIN diodes $D_k$ and $D_{k+4}$ are not used, the aforementioned bias voltage generator 211 is omitted. As indicated by the broken line in (C) of FIG. 8, the switch control signal SW-CONTk is turned OFF after the attenuator control signal ATT-CONTk is turned OFF (after the output level of the unit amplifier $15_k$ has been reduced to the minimum level), and turned ON before the attenuator control signal ATT-CONTk is turned ON. Each of the switches $SW_k$ and $SW_{k+4}$ may be a relay or a coaxial switch. The second embodiment of the present invention has advantages similar to those of the first embodiment of the present invention.

The present invention is not limited to the specifically disclosed embodiments, and variations and modifications may be made without departing from the scope of the present invention.

What is claimed is:

1. A power amplifier device comprising:
   m power amplifier units provided in parallel where m is an integer, each amplifier unit connected to a power supply line;
   distributing means, operatively coupled to said m power amplifier units, for distributing an input signal to said m amplifier units;
   combining means, operatively coupled to said m power amplified units, for combining m amplified input signals output by said m power amplifier units to generate an amplified output signal; and
   switch means, operatively coupled to said power amplifier units, for gradually disconnecting said m power amplifier units from said distributing means and said combining means and for gradually connecting said m power amplifier units to said distributing means and said combining means wherein the disconnecting and reconnecting of said power amplifier units occurs over a finite predetermined period of time by a gradual change in a voltage bias supplied to said switch means so that the occurrence of harmonic waves and the superimposition of noise on the power supply lines is substantially prevented.

2. A power amplifier device as claimed in claim 1, wherein:
   said switch means comprises 2m diodes, each having an anode terminal and a cathode terminal;
   m diodes among said 2m diodes are respectively connected between said distributing means and said m power amplifier units;
   m diodes of said 2m diodes other than said m diodes respectively connected between said distributing means and said m power amplifier units are respectively coupled between said m power amplifier units and said combining means; and said power amplifier device further comprises bias voltage generating means for respectively biasing said 2m diodes in accordance with a control signal which is supplied from an external device and which indicates which power amplifier unit should be disconnected and which power amplifier unit should be connected.

3. A power amplifier device as claimed in claim 2, wherein said bias voltage generating means comprises means for forwardly biasing two diodes related to a kth power amplifier unit (k=1, 2, ..., m) when said control signal indicates that said kth power amplifier unit be disconnected and for reversely biasing said two diodes when said control signal indicates that said kth power amplifier unit should be connected.

4. A power amplifier device as claimed in claim 2, wherein said switch means comprises:

voltage generating means, provided for each of said m power amplifier units, for generating a forward bias voltage and a reverse bias voltage;

selecting means, provided for each of said m power amplifier units, for selecting one of said forward bias voltage and said reverse bias voltage in accordance with said control signal and for applying a selected bias voltage applied to two of said 2m diodes related to one of said m power amplifier units; and control means, provided for each of said m power amplifier units, for gradually changing said selected bias voltage between said forward bias voltage and said reverse bias voltage during a predetermined period of time.

5. A power amplifier device as claimed in claim 2, wherein:

the anode terminal of each of said m diodes respectively provided between said distributing means and said m power amplifier units is coupled to an input terminal of a corresponding one of said m power amplifier units;

the cathode terminal of each of said m diodes respectively provided between said distributing means and said m power amplifier units is grounded;

the anode terminal of each of said m diodes respectively provided between said m power amplifier units and said combining means is coupled to an output terminal of a corresponding one of said m power amplifier; and the cathode terminal of each of said m diodes respectively provided between said m power amplifier units and said combining means is grounded.

6. A power amplifier device as claimed in claim 2, wherein:

the anode terminal of each of said m diodes respectively provided between said distributing means and said m power amplifier units is coupled to an input terminal of a corresponding one of said m power amplifier units;

the cathode terminal of each of said m diodes respectively provided between said distributing means and said m power amplifier units is coupled to said distributing means;

the anode terminal of each of said m diodes respectively provided between said m power amplifier units and said combining means is coupled to an output terminal of a corresponding one of said m power amplifier units; and the cathode terminal of each of said m diodes respectively provided between said m power amplifier units and said combining means is coupled to said combining means.

7. A power amplifier device as claimed in claim 5, further comprising filters, each filtering a bias voltage applied to the anode terminal of a corresponding one of the 2m diodes.

8. A power amplifier device as claimed in claim 1, wherein:

each of said m power amplifier units comprises automatic gain control means for automatically controlling a gain thereof; and said power amplifier device further comprises control means for controlling said automatic gain control means to reduce gain at almost the same time as said switch means starts to disconnect a corresponding one of said m power amplifier units from said distributing means and said combining means.

9. A power amplifier device as claimed in claim 8, wherein said power amplifier device further comprises means for activating said automatic gain control means when said corresponding one of said power amplifier units has been completely connected to said distributing means and said combining means after being disconnected.

10. A power amplifier device as claimed in claim 8, wherein said power amplifier device further comprises means for activating said automatic gain control means when a predetermined time has passed after said switch means starts to connect said corresponding one of said power amplifier units to said distributing means and said combining means.

11. A power amplifier device as claimed in claim 1, further comprising means for respectively stopping supplying power to said m power amplifier units after said switch means completely disconnects said m power amplifier units from said distributing means and said combining means.

12. A power amplifier device as claimed in claim 1, further comprising means for respectively starting to supply power to said m power amplifier units before said switch means completely connects said m power amplifier units to said distributing means and said combining means.

13. A power amplifier device comprising:

m power amplifier units provided in parallel where m is an integer;

distributing means, operatively coupled to said m power amplifier units, for distributing an input signal to said m amplifier units;

combining means, operatively coupled to said m power amplified units, for combining m amplified input signals output by said m power amplifier units to generate an amplified output signal;

control means, operatively coupled to said m power amplifier units, for respectively controlling said m power amplifier units to reduced gains in accordance with a control signal; and switch means, operatively coupled to said power amplifier units, for gradually disconnecting said m power amplifier units from said distributing means and said combining means after said control means respectively makes said m power amplifier units inactive and for respectively connecting said m power amplifier units to said distributing means and said combining means before said control means respectively stops controlling said m power amplifier units to said reduced gains, wherein the disconnecting and connecting of said power amplifier units occurs over a finite predetermined period of time by gradually changing a voltage bias supplied to said switch means so that the occurrence of harmonic waves and the superimposition of noise on the power supply lines is substantially prevented.

14. A power amplifier device as claimed in claim 13, wherein each of said 2m switches comprises a relay.

15. A power amplifier device as claimed in claim 13, wherein each of said 2m switches comprises a coaxial switch.

16. A power amplifier device as claimed in claim 13, further comprising means for respectively stopping supplying power to said m power amplifier units after said switch means completely disconnects said m power amplifier units from said distributing means and said combining means.

17. A power amplifier device as claimed in claim 13, further comprising means for respectively starting to supply power to said m power amplifier units before said switch means completely connects said m power amplifier units to said distributing means and said combining means.

18. A power amplifier device, comprising:

m power amplifier units provided in parallel where m is an integer;

distributing means, operatively coupled to said power amplifier units, for distributing an input signal to said m power amplifier unit;

combining means, operatively coupled to said m power amplifier units, for combining m amplified input signals output by said m power amplifier units to generate an amplified output signal;

switch means, operatively coupled to said power amplifier unit, for gradually disconnecting said m power amplifier units from said distributing means and said combining means and for gradually connecting said m power amplifier units to said distributing means and said combining means, wherein said switch means comprises 2m diodes, each having an anode terminal and a cathode terminal, wherein m diodes among said 2m diodes are respectively connected between said distributing means and said m power amplifier units, and wherein m diodes of said 2 m diodes other than said m diodes respectively connected between said distributing means and said m power amplifier units are respectively coupled between said m power amplifier units and said combining means; and bias voltage generating means for respectively biasing said 2m diodes in accordance with a control signal which is supplied from an external device and which indicates which power amplifier should be disconnected and which power amplifier should be connected.

19. A power amplifier device as claimed in claim 18, wherein said bias voltage generating means comprises means for forwardly biasing two diodes related to a kth power amplifier unit (k=1, 2, ..., m) when said control signal indicates that said kth power amplifier unit be disconnected and for reversely biasing said two diodes when said control signal indicates that the kth power amplifier unit should be connected.

20. A power amplifier device as claimed in claim 18, wherein said switch means comprises:

voltage generating means, provided for each of said m power amplifier units, for generating a forward bias voltage and a reverse bias voltage;

selecting means, provided for each of said m power amplifier units, for selecting one of said forward bias voltage and said reverse bias voltage in accordance with said control signal and for applying a selected bias voltage applied to two of said 2m diodes related to one of said m power amplifier units; and control means, provided for each of said m power amplifier units, for gradually changing said selected bias voltage between said forward bias voltage and said reverse bias voltage during a predetermined period of time.

21. A power amplifier device as claimed in claim 18, wherein:

the anode terminal of each of said m diodes respectively provided between said distributing means and said m power amplifier units is coupled to an input terminal for corresponding one of said m power amplifier units;

the cathode terminal of each of said m diodes respectively provided between said distributing means and said m power amplifier units is grounded;

the anode terminal of each of said m diodes respectively provided between said m power amplifier units and said combining means is coupled to an output terminal of a corresponding one of said m power amplifier; and the cathode terminal of each of said m diodes respectively provided between said m power amplifier units and said combining means is grounded.

22. A power amplifier device as claimed in claim 18, wherein:

the anode terminal of each of said m diodes respectively provided between said distributing means and said m power amplifier units is coupled to an input terminal and a corresponding one of said m power amplifier units;

the cathode terminal of each of said m diodes respectively provided between said distributing means and said m power amplifier units is coupled to said distributing means;

the anode terminal of each of said m diodes respectively provided between said m power amplifier units and said combining means is coupled to an output terminal of a corresponding one of said m power amplifier units; and the cathode terminal of each of said m diodes respectively provided between said m power amplifier units and said combining means is coupled to said combining means.

23. A power amplifier device as claimed in claim 21, further comprising filters, each filtering a bias voltage applied to the anode terminal of a corresponding one of the 2m diodes.

24. A power amplifier device as claimed in claim 18, wherein:

each of said m power amplifier units comprises automatic gain control means for automatically controlling a gain thereof; and said power amplifier device further comprises control means for controlling said automatic gain control means to reduce gain at almost the same time as said switch means starts to disconnect a corresponding one of said m power amplifier units from said distributing means and said combining means.

25. A power amplifier device as claimed in claim 24, wherein said power amplifier device further comprises means for activating said automatic gain control means when said corresponding one of said power amplifier units has been completely connected to said distributing means and said combining means after being disconnected.

26. A power amplifier device as claimed in claim 24, wherein said power amplifier device further comprises means for activating said automatic gain control means when a predetermined time has passed after said switch means starts to connect said corresponding one of said power amplifier units to said distributing means and said combining means.

27. A power amplifier device as claimed in claim 18, further comprising means for respectively stopping supplying power to said m power amplifier units after said switch means completely disconnects said m power amplifier units from said distributing means and said combining means.

28. A power amplifier device as claimed in claim 18, further comprising means for respectively starting to supply power to said m power amplifier units before said switch means completely connects said m power amplifier units to said distributing means and said combining means.

* * * * *